(12) United States Patent
Miyano (10) Patent No.: US 10,924,097 B2
(45) Date of Patent: Feb. 16, 2021

(54) SHIFTER CIRCUITS HAVING REGISTERS ARRANGED IN A FOLDED TOPOLOGY

(71) Applicant: MICRON TECHNOLOGY, INC., Boise, ID (US)

(72) Inventor: Kazutaka Miyano, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/834,892

(22) Filed: Mar. 30, 2020

(65) Prior Publication Data

US 2020/0228107 A1 Jul. 16, 2020

Related U.S. Application Data

(63) Continuation of application No. 16/012,715, filed on Jun. 19, 2018, now Pat. No. 10,608,620.

(51) Int. Cl.
| | |
|---|---|
| *G11C 8/00* | (2006.01) |
| *H03K 5/135* | (2006.01) |
| *H03K 5/133* | (2014.01) |
| *G11C 8/10* | (2006.01) |
| *G11C 8/18* | (2006.01) |
| *G11C 7/22* | (2006.01) |

(52) U.S. Cl.
CPC ............. *H03K 5/135* (2013.01); *G11C 7/22* (2013.01); *G11C 8/10* (2013.01); *G11C 8/18* (2013.01); *H03K 5/133* (2013.01); *G11C 2207/2272* (2013.01)

(58) Field of Classification Search
CPC .. H03K 5/135; G11C 7/22; G11C 8/10; G11C 8/18
USPC ....................................................... 365/230.06
See application file for complete search history.

(56) References Cited

U.S. PATENT DOCUMENTS

| | | | |
|---|---|---|---|
| 4,721,958 A | 1/1988 | Jenkin | |
| 5,406,518 A * | 4/1995 | Sun | ........................... G06F 5/10 348/E5.016 |
| 6,067,632 A | 5/2000 | Yamaguchi | |
| 9,531,363 B2 | 12/2016 | Miyano | |
| 2003/0001635 A1* | 1/2003 | Lee | ........................ H03L 7/089 327/158 |
| 2003/0042961 A1* | 3/2003 | Gomm | ..................... G11C 7/22 327/276 |
| 2006/0250861 A1 | 11/2006 | Park et al. | |
| 2010/0164568 A1 | 7/2010 | Choi et al. | |
| 2019/0386648 A1 | 12/2019 | Miyano | |

* cited by examiner

*Primary Examiner* — Vu A Le
(74) *Attorney, Agent, or Firm* — Dorsey & Whitney LLP (57) ABSTRACT

Examples described herein include command latency shifters which may include a plurality of registers arranged in a folded topology.

20 Claims, 12 Drawing Sheets

SHIFTER CIRCUITS HAVING REGISTERS ARRANGED IN A FOLDED TOPOLOGY

CROSS-REFERENCE TO RELATED APPLICATION(S)

This application is a continuation of U.S. patent application Ser. No. 16/012,715, filed on Jun. 19, 2018. The aforementioned application is incorporated herein by reference, in its entirety, for any purpose.

BACKGROUND

Latency shifters may be used, for example in memory devices, to delay a signal, such as a command signal. A number of flip-flops in a shifter circuit may be selected to delay a signal a desired amount of clock cycles.

Figure 4A:
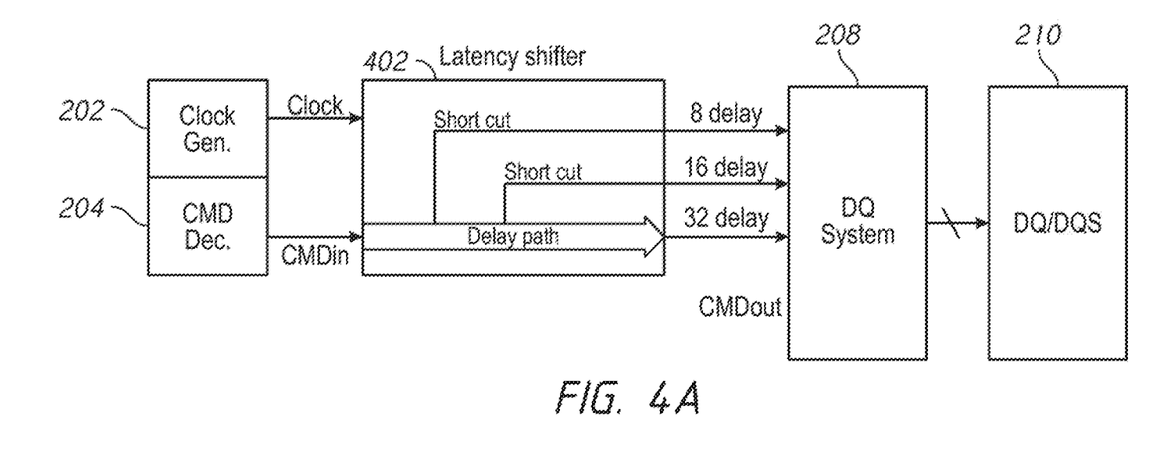
FIGS. 4A and 4B are schematic illustration of an apparatus arranged in accordance with conventional techniques.
Figure 4B:
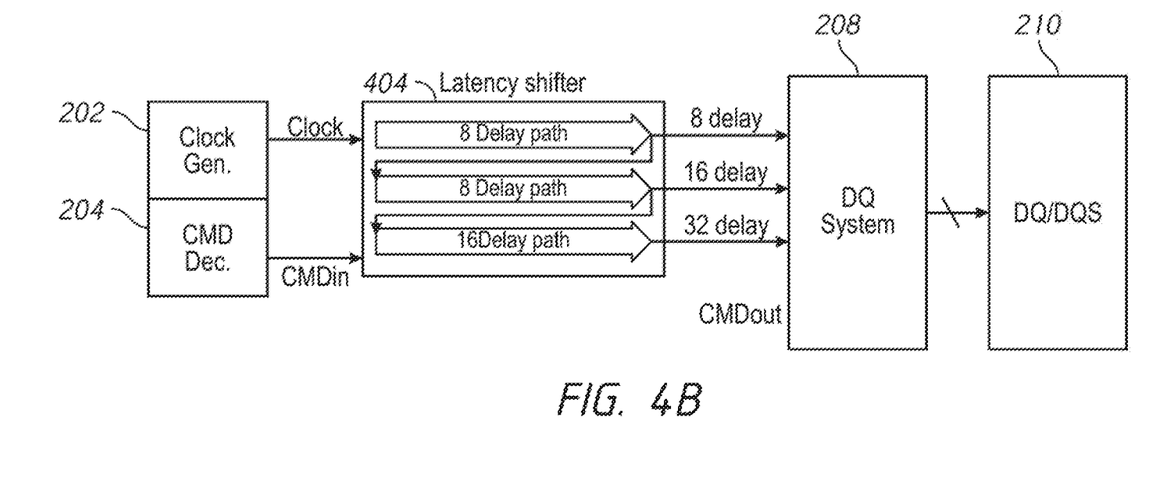

FIG. 4A and FIG. 4B are schematic illustrations of apparatuses arranged in accordance with conventional techniques. FIG. 4A and FIG. 4B both include clock generator 202, command decoder 204, DQ system 208, and DQs 210 which may be similar components to those with the same reference number described with reference to FIG. 2. FIG. 4A includes latency shifter 402 and FIG. 4B includes latency shifter 404. The latency shifter 402 of FIG. 4A provides a line of flip-flops between the input and the output of the latency shifter 402. The output along the line of flip-flops may be selected by selecting an appropriate "short cut" to route the signal out of a particular register as the output signal. The latency shifter 404 of FIG. 4B provides multiple lines of flip-flops between the input and the output of the latency shifter 404—each having a different length. An amount of delay may be selected by selecting which line of flip-flops to route the input signal through. Note that, in both latency shifter 402 and latency shifter 404, the last flip-flop a signal may pass through may be different depending on how much delay is provided. The latency shifter 402 and latency shifter 404 both receive an input signal (e.g., CMDin) at a left side of the shifter and provide an output signal (e.g., CMDout) at a right side of the shifter at an opposite end of a line of flip flops which extend from the input to the output. In this manner, the input and output flip flop may be located some distance from one another.

In conventional examples, a signal may be passed through a different number of selectors (e.g., multiplexers) depending on a number of flip-flops selected, which may result in a speed difference based on how much delay is selected. In some conventional examples, gate and wiring capacitances at the contact point of the input signal to be provided to all flip-flops in the shifter may be undesirably large.

In some conventional examples, drivers of clocks for the respective flip-flop groups may be arranged in such a way that parasitic capacitances may increase charge/discharge currents undesirably.

DETAILED DESCRIPTION

Certain details are set forth below to provide a sufficient understanding of described embodiments. However, it will be clear to one skilled in the art that embodiments may be practiced without various of these particular details. In some instances, well-known circuits, control signals, timing protocols, and/or software operations have not been shown in detail in order to avoid unnecessarily obscuring the described embodiments.

Figure 1:
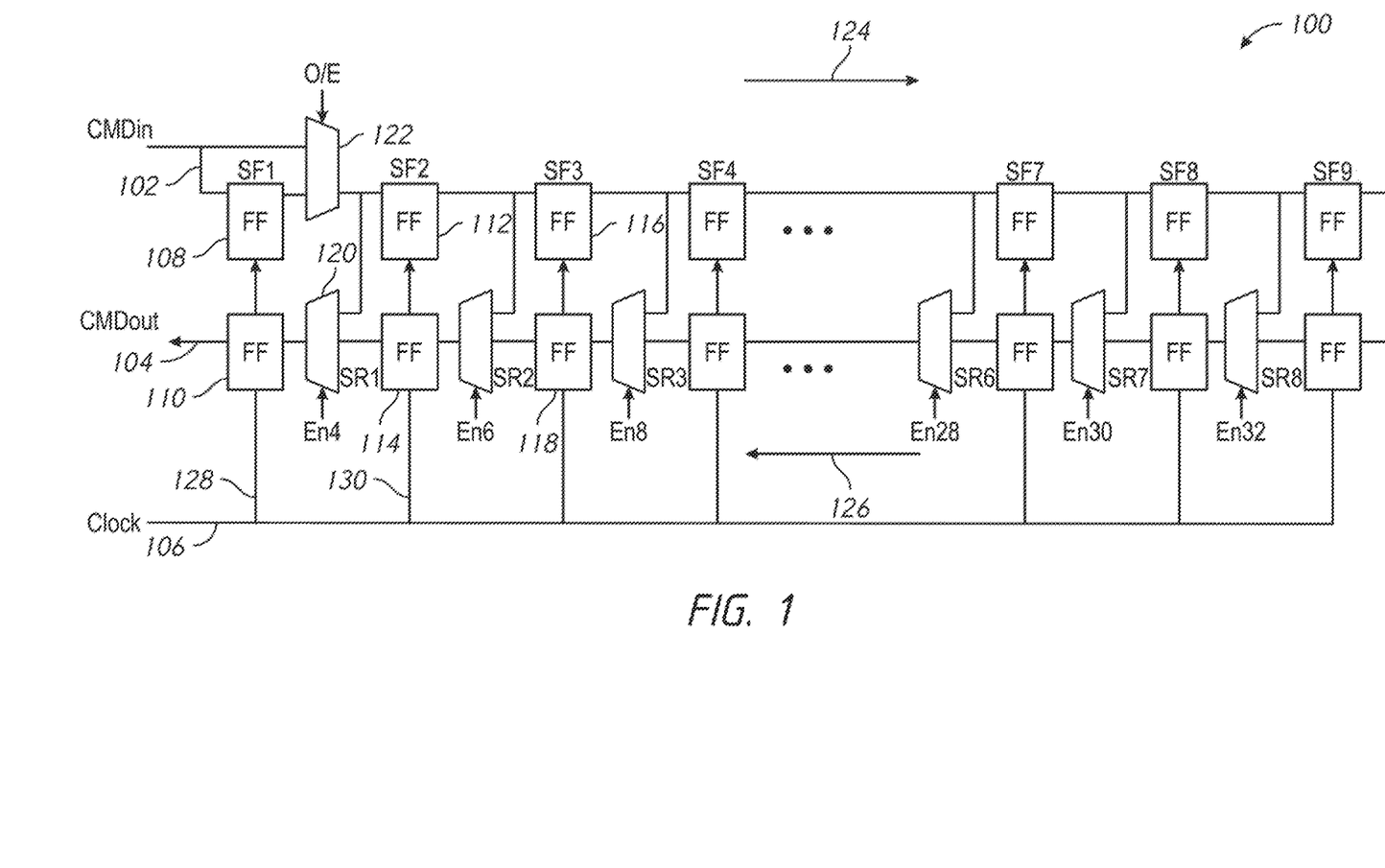
FIG. 1 is a schematic illustration of a shifter arranged in accordance with examples described herein.

FIG. 1 is a schematic illustration of a shifter arranged in accordance with examples described herein. The shifter 100 includes input 102, output 104, conductive line 106, register 108, register 110, register 112, register 114, register 116, register 118, multiplexer 120, multiplexer 122, branch 128, and branch 130. A number of registers are arranged inline along direction of signal propagation 124. Another number of registers are arranged inline along direction of signal propagation 126. In other examples, additional, different, and/or fewer components may be used. Additional registers and branches are shown in FIG. 1 without specific reference numbers, but may be described with reference to their output signals shown in FIG. 1.

The shifter 100 may include input 102. The input 102 may, for example, provide a command signal as an input to shifter 100. In other examples, other types of signals may be input into input 102 for which shifting may be desired.

The shifter 100 may include one or more registers. Register 108, register 110, register 112, register 114, register 116, and register 118 are labeled in FIG. 1. Additional registers are also shown in FIG. 1 having outputs labeled SF4-SF9 and SR3-SR8. Any number of registers may be used to implement shifters described herein, including 4, 6, 8, 10, 12, 14, 16, 18, 20, 22, 24, 26, 28, or 30 registers. In other examples, other numbers of registers may be used. In some examples, an even number of registers are used. Registers described herein, including register 108, register 110, register 112, register 114, register 116, register 118 and/or other registers shown in FIG. 1 or described herein may be implemented using one or more flip-flops (e.g., flip-flop circuits). Registers may further include a clock input for receipt of a clock signal. During operation, each register may delay an input signal by one clock cycle.

Generally, the registers of shifter 100 are arranged along two paths, a first signal propagation path arranged in direction of signal propagation 124 and another signal propagation path arranged in direction of signal propagation 126.

As described herein, registers arranged along the first signal propagation path may be connected in series. For example, an output of the register 108 may be coupled to an input of register 112. An output of register 112 may be coupled to an input of register 116. In some examples, the connection between registers may be direct and/or indirect (e.g., other components may be in between the registers). Additional registers may further be connected in line—e.g., registers in FIG. 1 having the outputs SF4-SF9. In this manner, a number of registers may be arranged in line in a first direction (e.g., along direction of signal propagation 124).

Registers arranged along the second signal propagation path may be connected in series. For example, an output of the register 118 may be coupled to an input of register 114. The output of register 114 may be coupled to an input of register 110. Additional registers may be connected in line in the second signal propagation path—e.g., registers in FIG. 1 having the outputs SR8-SR3.

The first and second signal propagation paths may be crossing paths—e.g., may be arranged in opposite directions, as shown in FIG. 1 by direction of signal propagation 124 and direction of signal propagation 126. Accordingly, registers of shifters described herein may have a folded layout (e.g. trombone layout) where registers are arranged along a first propagation path in one direction, then along a second propagation path in an opposite direction, such that an input and an output of the shifter may be proximate (e.g., adjacent) one another. While two propagation paths are shown in FIG. 1, any number may be used. In some examples, 4 propagation paths may be used, with a signal propagated away from an input, toward an input, away from an input, and again back toward the input to arrive at the output placed on a same side of the shifter as the input. Generally, then, shifters described herein may include multiple registers (e.g., flip-flops) coupled in cascade to form a signal propagation path. The signal propagation path may be folded (e.g., in two, in four, etc.) to form multiple propagation paths.

The register 108 may be an input register which may receive an input signal, such as a command, at an input of the register 108. The register 110 may be an output register which may provide an output signal, such as a shifted command, at an output of the register 110. As shown in FIG. 1, in the layout, the register 108 and register 110 are proximate (e.g., adjacent) one another such that the register 108 and the register 110 are at a same end of the shifter 100.

Shifters described herein may include multiplexers, which may be used to select a number of registers through which to propagate a signal. Each multiplexer may be positioned between two of the registers along the second signal propagation path (e.g., the return propagation path) and may have an input coupled to an output of one of the registers arranged along the first propagation path. For example, the multiplexer 120 may have a first input end (e.g., input port) connected to an output of the register 108, a second input end (e.g., input port) connected to an output of the register 114, and an output end (e.g., output port) connected to an input of the register 110. The multiplexers may operate to provide one of the signals at their input ends to their output end responsive to an enable signal received at an enable end of the multiplexer. For example, the multiplexer 120 may provide the signal from the output of the register 108 or the signal from the output of the register 114 to the input of the register 110 in accordance with enable signal En4 received at an enable end (e.g., enable port) of the multiplexer 120. Accordingly, when the multiplexer 120 is enabled with En4 to provide the output of the register 108 to the input of register 110, an input signal may propagate through two registers in the system—register 108 and register 110. Accordingly, two registers of delay may be applied to an input signal using enable signal En4.

Additional multiplexers may be provided which may allow for selection of different amounts of delay. Multiplexers are shown in FIG. 1 controlled by signals En6, En8, En28, En30, and En32. Activating a selected multiplexer may select an amount of delay provided to a signal by the shifter 100. Activating a selected multiplexer selects a length of the first signal propagation path through which a signal will propagate before being provided to the second propagation path to propagate to an output of the shifter 100.

In some examples, a multiplexer may be provided which may allow for propagation of a signal through a single register and/or through an odd number of registers. For example, in FIG. 1, multiplexer 122 is provided. One input end of the multiplexer 122 is connected to an input of the shifter 100 and another input end of the multiplexer 122 is connected to an output of register 108. The output end of multiplexer 122 is connected to an input of multiplexer 120 and an input of register 112. In this manner, the multiplexer 122 may be controlled by enable signal O/E to either provide an output of register 108 or the input signal (e.g., CMDin) to the register 112 and an input of multiplexer 120. This may allow the shifter 100 to bypass register 108, resulting in an odd number of registers through which the signal may be propagated. For example, if the O/E signal is provided to bypass register 108 and multiplexer 120 is enabled by En4, a single unit of delay may be provided since an input signal may be provided by multiplexer 122 and multiplexer 120 to register 110. The register 110 may then provide the input signal as an output signal, having passed through only the single register 110.

Examples of shifters described herein may include a clock distribution network that may provide a clock signal to registers of the shifter. For example, referring to FIG. 1, a clock signal may be provided on conductive line 106. The conductive line 106 extends along the shifter 100 in a direction parallel to the direction of signal propagation 124 and direction of signal propagation 126. The conductive line 106 may be connected to a number of branch lines, such as branch 128 and branch 130. The branch lines may be perpendicular to the direction of signal propagation of the shifter 100. The branch lines may provide the clock signal to two registers—one of which may be in the first propagation path and another of which may be in the second propagation path. For example, the branch 128 may provide a clock signal to register 108 and register 110. Note that this allows both an input register of the shifter 100 and an output register of the shifter 100 to receive a clock signal from a same branch. This may promote alignment of the shifter input and output in some examples.

Note that with a layout as shown in FIG. 1 having a folded layout of registers and multiplexers for selection of delay amount, each of the registers in the first propagation path (e.g., each of the registers in line propagating signals away from an input of the shifter) may have the same fan-out. Each of the registers in the second propagation path (e.g., each of the registers in line propagating signals toward the output of the shifter) may have a same fan-out. Moreover, each of the multiplexers arranged between registers in the second propagation path may have a same fan-out. The similarity of fan-out may allow for high speed operation in some examples.

Figure 2:
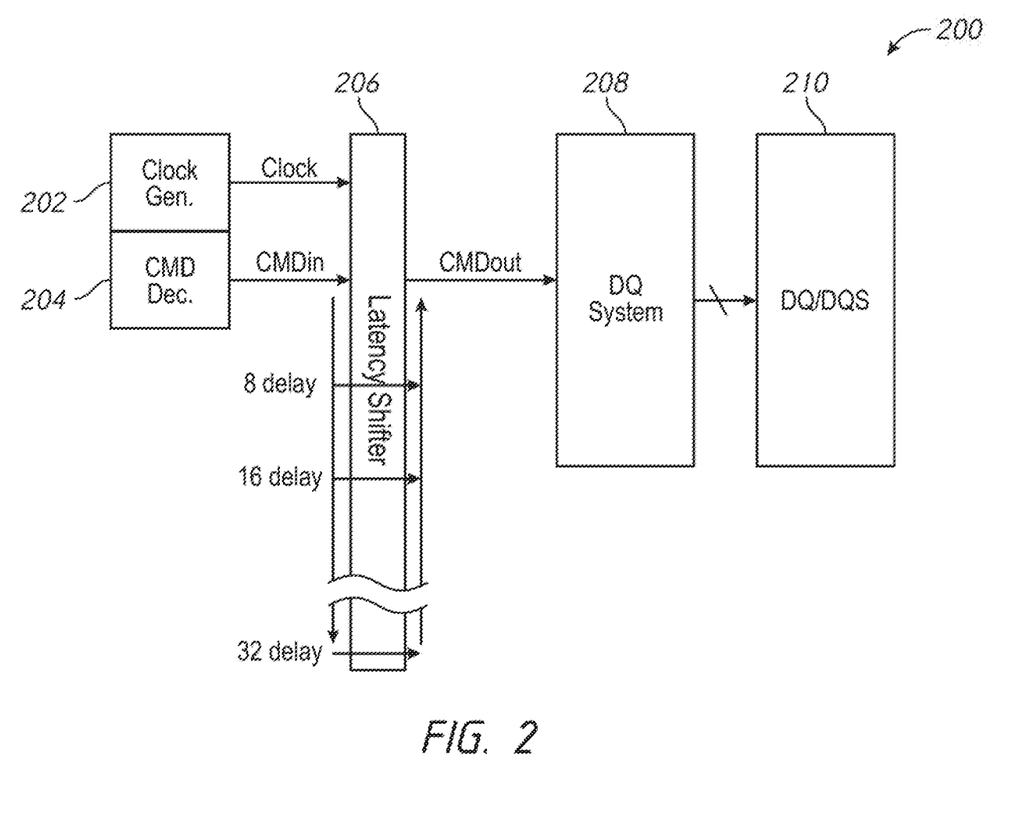
FIG. 2 is a schematic illustration of an apparatus arranged in accordance with examples described herein.

FIG. 2 is a schematic illustration of an apparatus arranged in accordance with examples described herein. The apparatus 200 includes clock generator 202, command decoder 204, latency shifter 206, DQ system 208, and DQs 210. Additional, fewer, and/or different components may be used in other examples. The apparatus 200 may form all or a portion of a memory device and/or memory device subsystem in some examples. The latency shifter 206 may be implemented by and/or used to implement shifters described herein, such as shifter 100 of FIG. 1.

The clock generator 202 may generate a clock signal. The clock generator 202 may be coupled to the latency shifter 206 and may provide the clock signal to latency shifter 206. The command decoder 204 may generate a command signal. The command decoder 204 may be coupled to the latency shifter 206 and may provide the command signal to the latency shifter 206. The latency shifter 206 may shift the command signal by providing an amount of delay to the clock signal to output a shifted command signal. The shifted command signal, e.g., CMDout, may be provided to DQ system 208. The DQ system 208 may be coupled to DQs 210 for access to DQ ports of a memory system.

The command decoder 204 may generate a command signal. For example, the command decoder 204 may receive a command and may output a decoded command, which may be referred to as a command signal. The command signal may be provided by another computing system and/or memory device component, such as a controller.

The latency shifter 206 may include an input node an output node and a plurality of registers (e.g., flip-flops) coupled in cascade between the input node and the output node to form a signal propagation path. The signal propagation path may be folded (e.g., in two, in four, etc.) to form a first propagation path and a second propagation path. In this manner, the decoded command may be propagated from the input node through the first propagation path in a first direction and further propagated to the output node through the second propagation path in a second direction, which may be reverse to the first direction. Accordingly, an input node and an output node of the latency shifter 206 may be provided adjacent one another (e.g., on a same end of the latency shifter 206). In FIG. 2, the input node and output node are illustrated near a top end of the latency shifter 206.

The latency shifter may receive the decoded command at the input node and propagate the decoded command through the signal propagation path to the output node. The amount of delay imposed by the latency shifter 206 may be selected by one or more enable signals. The enable signals may, for example, be provided to one or more multiplexers of the latency shifter 206 which may facilitate selection of a length of the signal propagation path through which the decoded command may be propagated.

The latency shifter 206 may provide the shifted signal (e.g., shifted decoded command) to the DQ system 208. The DQ system 208 may be implemented by a data input/output circuit which may be coupled to the output node of the latency shifter 206. The DQ system 208 may receive the decoded command and may coordinate access to DQs 210 in accordance with the decoded command. The DQs 210 may be implemented, for example, by data pins of a memory device.

Figure 3:
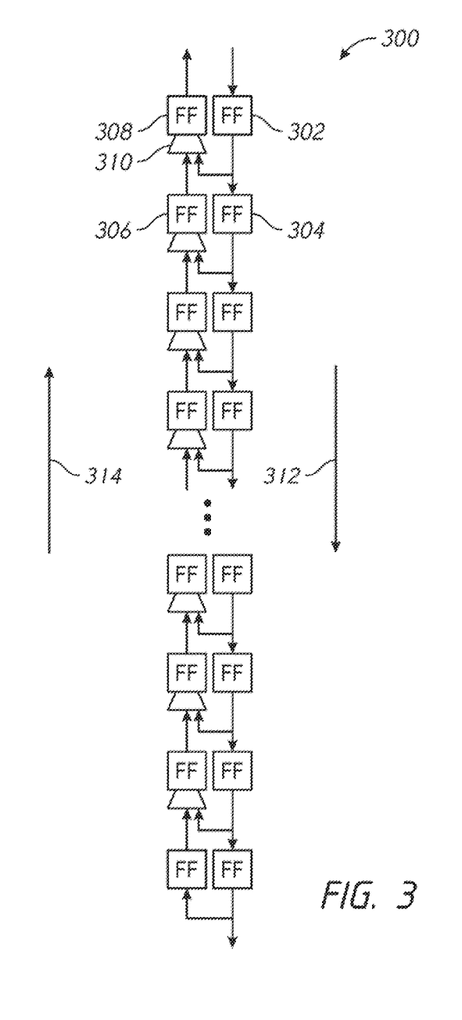
FIG. 3 is a schematic illustration of a shifter arranged in accordance with examples described herein.

FIG. 3 is a schematic illustration of a shifter arranged in accordance with examples described herein. The shifter 300 may be used to implement the latency shifter 206 of FIG. 2, for example. The shifter 300 includes a plurality of registers (e.g., flip-flops, labeled "FF" in FIG. 3) and multiplexers arranged as shown in FIG. 3. The registers may propagate a signal along a signal propagation path which may include a portion arranged along direction of propagation 312 and a portion arranged along direction of propagation 314. The multiplexers may control where along the direction of propagation 312 the signal may be coupled to the other propagation path to propagate in direction of propagation 314. This may control a total amount of delay applied to the propagating signal.

The shifter 300 is shown laid out vertically, as may be used to implement latency shifter 206. The shifter 300 may include an input register, e.g., register 302 and an output register, e.g., register 308. The register 302 and register 308 may be adjacent one another (e.g., positioned at a same end of the shifter 300). Multiple registers, including register 302 and register 304, may be coupled together in line along direction of propagation 312. Multiple registers, including register 306 and register 308 may be coupled together and in line along direction of propagation 314. Multiplexers such as multiplexer 310 may control where a signal may be coupled from direction of propagation 312 to direction of propagation 314.

In contrast to FIG. 4A and FIG. 4B, note that the input and output registers may be located adjacent one another (e.g., not physically separated by the remaining registers in the signal propagation path).

Figure 5:
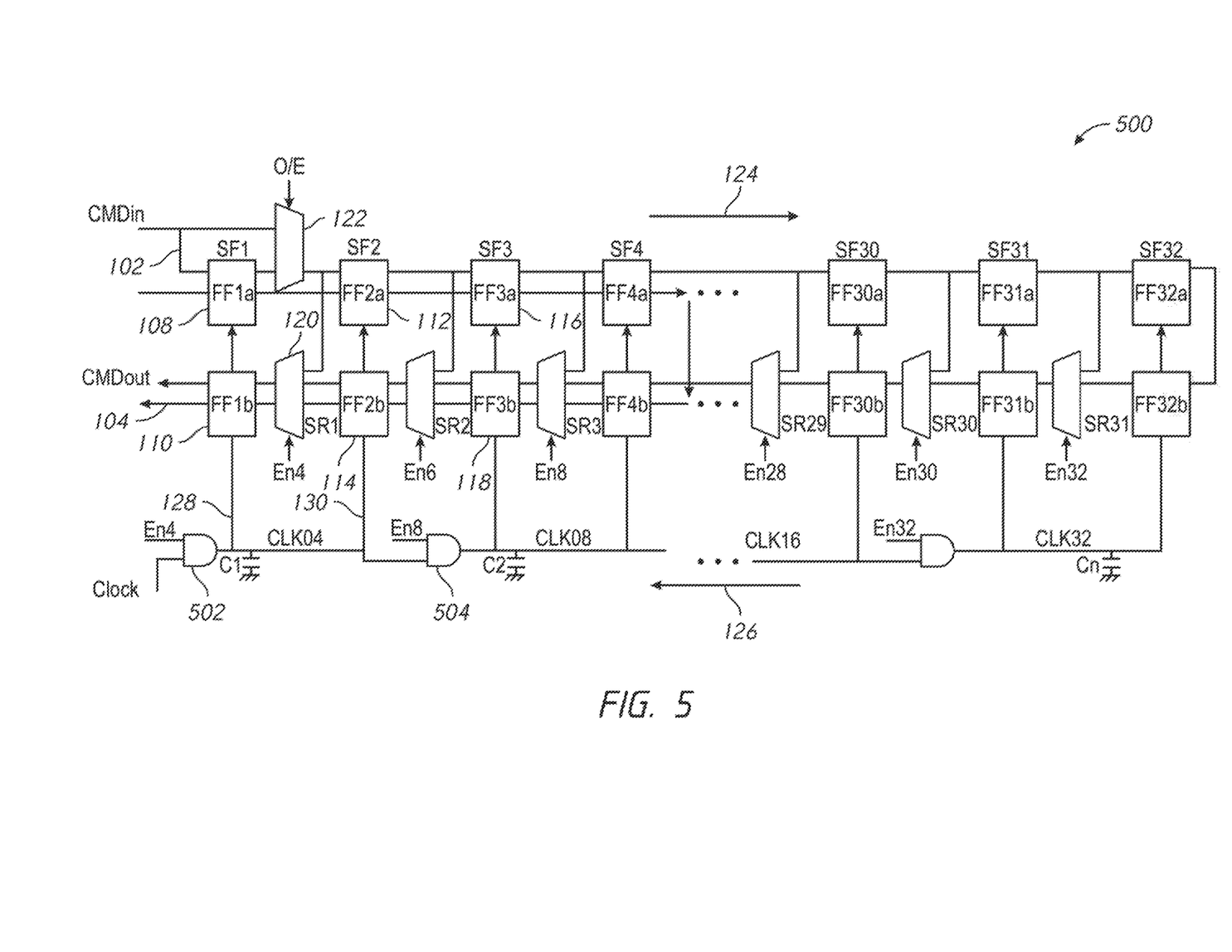
FIG. 5 is a schematic illustration of an apparatus arranged in accordance with examples described herein.

FIG. 5 is a schematic illustration of an apparatus arranged in accordance with examples described herein. The shifter 500 may include like components to the shifter 100 of FIG. 1, such as input 102, output 104, register 108, register 110, register 112, register 114, register 116, register 118, multiplexer 120, and multiplexer 122. Registers may be arranged along direction of signal propagation 124 and return along direction of signal propagation 126. The shifter 500 may be used to implement and/or may be implemented by latency shifter 206 of FIG. 2.

The example of shifter 500 shown in FIG. 5 differs from that shown in FIG. 2 by its distribution of clock signals. The shifter 500 may facilitate some clock toggle operations to be stopped and/or avoided based on a selected amount of latency (e.g., delay).

The clock signal of FIG. 5 may be provided to different stages of the shifter 500 using respective buffers. The buffers may be implemented by logic gates (e.g., gate 502, gate 504). The logic gates (e.g., gate 502, gate 504) may be implemented by NAND gates as shown in FIG. 5. Accordingly, clock signals may be provided to respective registers responsive to the respective enable signal(s) also being provided to the logic gates. For example, the gate 502 may provide a clock signal CLK04 to register 110 and register 114 responsive to the enable signal En4 provided at the input of gate 502.

In this manner, examples such as shown with respect to shifter 500 may allow for a reduced size of each of the buffers and the width of clock wiring (e.g. narrower conductive lines to carry the clock signal CLK may be used). The example of FIG. 5 may reduce the size of the shifter and current flowing through the shifter at least in part because the shifter 500 may not need to distribute the clock signal CLK from the beginning toward the end of the shifter 500 at the same timing. This may also reduce a parasitic capacitance of the clock wiring. Moreover, the gates used (e.g., gate 502) may not need to be large, as they drive only local components, not across the whole shifter 500.

Figure 6:
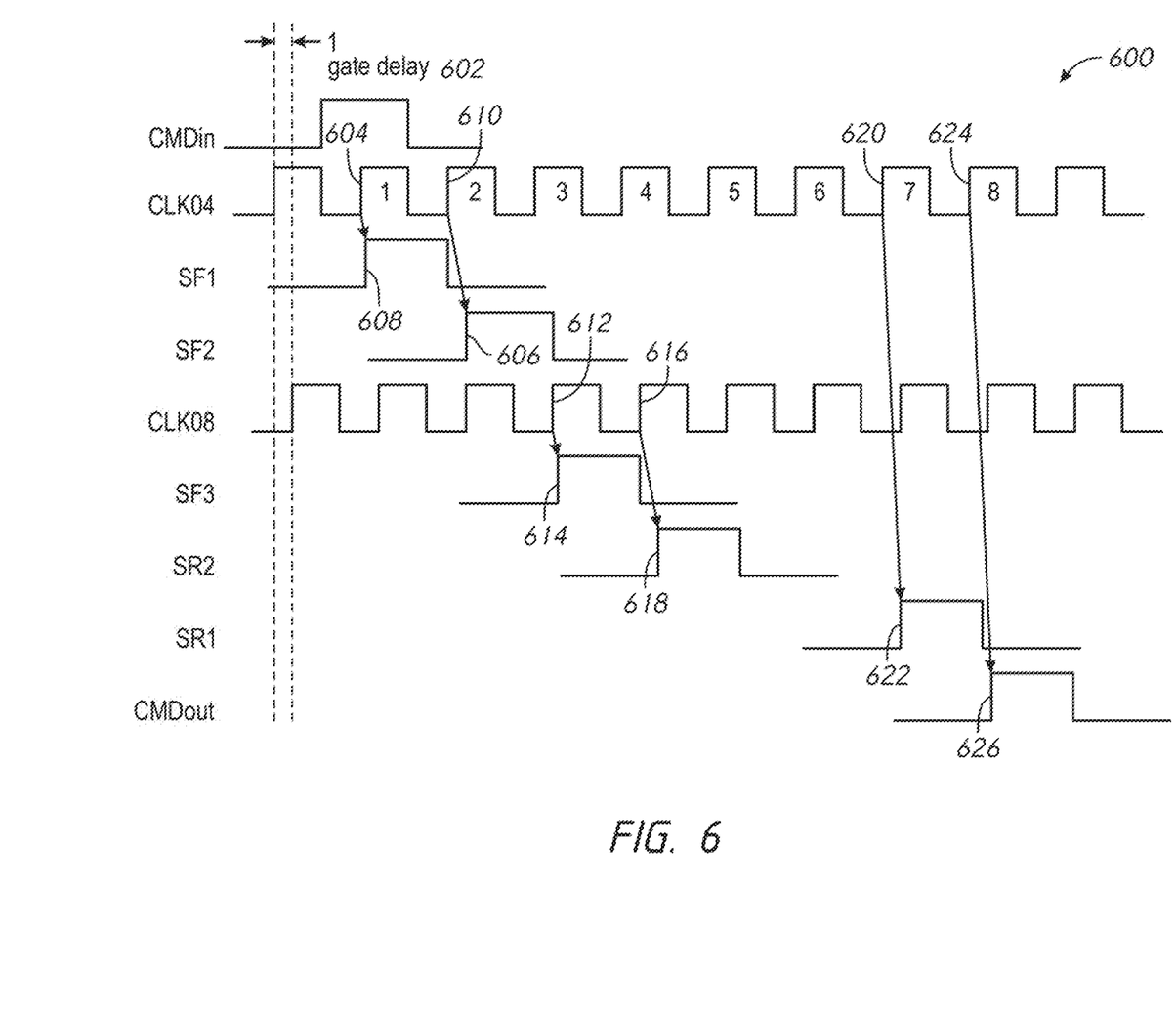
FIG. 6 is a timing diagram illustrating operation of the shifter 500 of FIG. 5.

FIG. 6 is a timing diagram illustrating operation of the shifter 500 of FIG. 5. In the example of FIG. 6, a latency of eight clock periods is provided by the shifter 500. Accordingly, the enable signals En4 and En8 would be provided in the example of FIG. 6 to achieve eight clock period delay.

An amount of a single gate delay is shown by one gate delay 602. A waveform of an input command, CMDin, is shown in FIG. 6. Responsive to a first rising clock edge (e.g., CLK04) following the rise of the command signal (e.g., at time 604), an output of register 108 may also rise, as shown at time 608. Responsive to a second rising clock edge of the clock signal (e.g., CLK04) following the rise of the command signal (e.g., at time 610), an output of register 112 may rise, at time 606.

The clock signal provided to subsequent registers (e.g., CLK08) may have timing shifted from an initial clock signal, CLK04, by one gate delay 602. The delay between CLK04 and CLK08 may be due to, for example, gate 504.

Responsive to a third rising clock edge of the clock signal (e.g., CLK08) following the rise of the command signal (e.g., at time 612), an output of a next register, e.g., register 116, may rise at time 614. Due to the En8 signal, the register 116 may be coupled to a register in the return path of registers, e.g., through a multiplexer. Responsive to a fourth rising clock edge of the clock signal (e.g., CLK08) following the rise of the command signal (e.g., at time 616), an output of a register in the return path, SR2, may rise at time 618.

Responsive to a seventh rising edge of the clock signal (e.g., at time 620, CLK04), the output of register 114 (e.g., SR1) may rise (e.g., at time 622). Responsive to an eighth rising edge of the clock signal (e.g., at time 624, CLK04), the output of register 110 may rise, providing output 104.

Note that the CMDout signal (e.g., output 104) is provided in response to CLK04, which is a same clock that clocks in the input signal CMDin (e.g., input 102). Accordingly, clock delay by buffers in the clock distribution network may be cancelled by the folded structure described herein, where an input and output register are clocked by a same clock with a same amount of delay in the clock distribution network.

Figure 7:
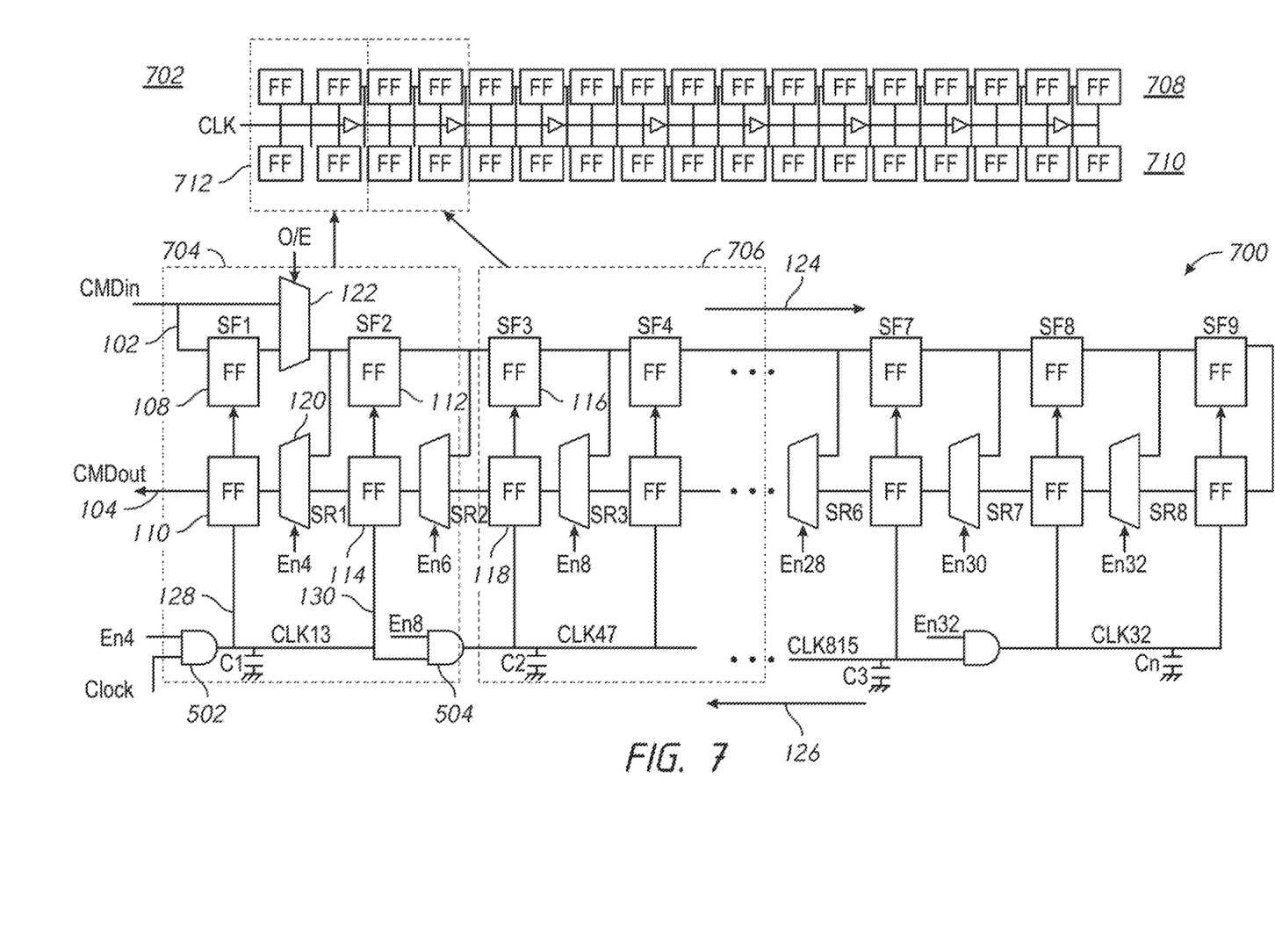
FIG. 7 is a schematic illustration of an apparatus arranged in accordance with examples described herein.

FIG. 7 is a schematic illustration of an apparatus arranged in accordance with examples described herein. The shifter 700 may include like components to the shifter 100 of FIG. 1 and/or the shifter 500 of FIG. 5, such as input 102, output 104, register 108, register 110, register 112, register 114, register 116, register 118, multiplexer 120, multiplexer 122, gate 502, and gate 504. The shifter 700 may be used to implement and/or may be implemented by latency shifter 206 of FIG. 2, and/or the shifter 500 of FIG. 5.

The example of FIG. 7 illustrates how four registers may be wired as a unit, e.g., unit 704 and unit 706. This may allow for a high clock operation on a large number of units (e.g., 100 units or even 10000 units). A layout 702 is also shown for shifter 700. The unit 704 may have a layout shown as unit 712, for example. The layout may provide a number of registers in a forward signal propagation path 708 and a number of registers in a return signal propagation path 710.

The forward signal propagation path 708 and return signal propagation path 710 may be laid out adjacent one another, which may allow for critical paths to be reduced and/or minimized. A conductive line carrying the clock signal CLK may be positioned as shown between the forward signal propagation path 708 and return signal propagation path 710 and parallel to both the forward signal propagation path 708 and return signal propagation path 710.

Figure 8:
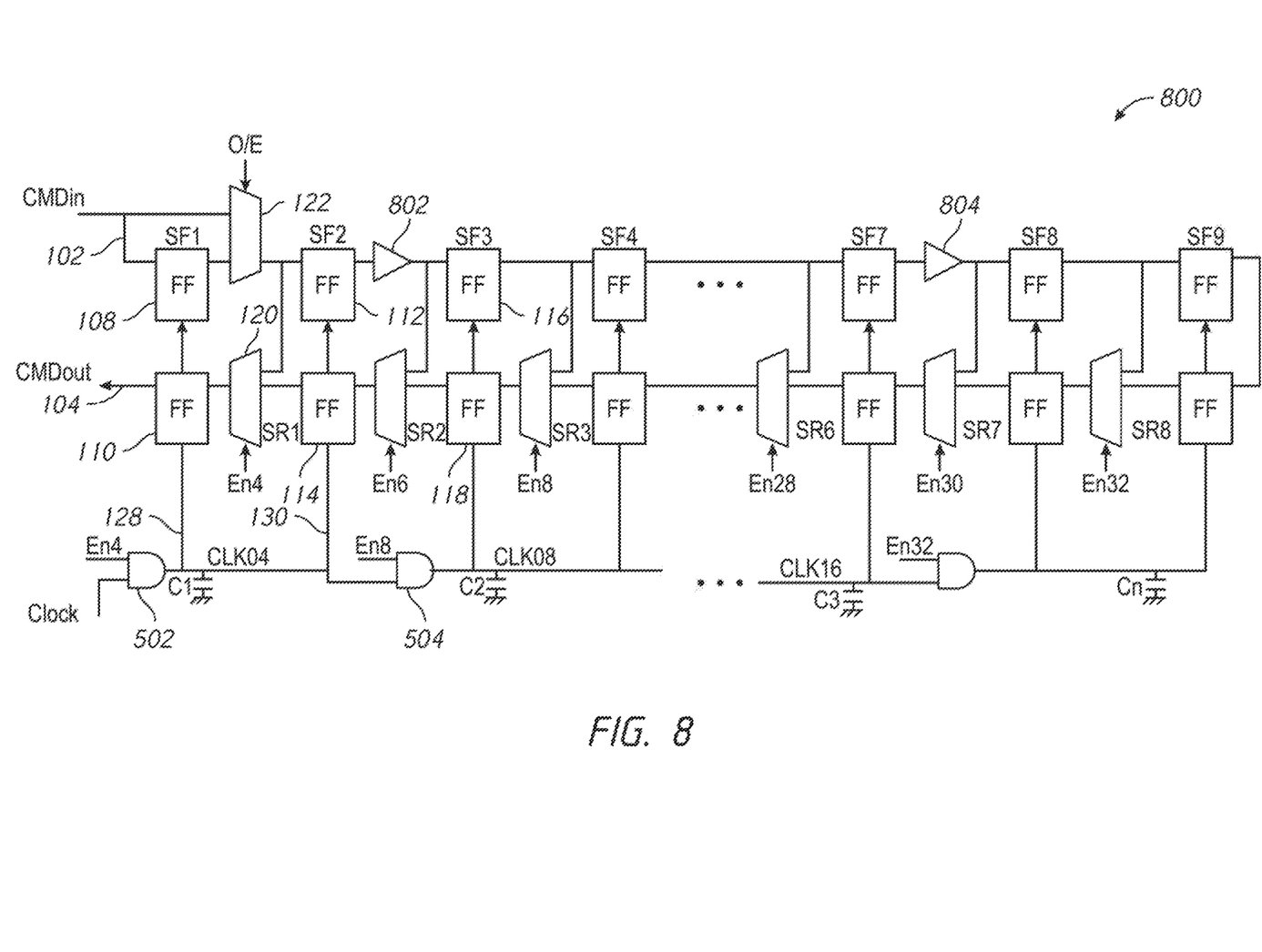
FIG. 8 is a schematic illustration of an apparatus arranged in accordance with examples described herein.

FIG. 8 is a schematic illustration of an apparatus arranged in accordance with examples described herein. The shifter 800 may include like components to the shifter 100 of FIG. 1 and/or the shifter 500 of FIG. 5, such as input 102, output 104, register 108, register 110, register 112, register 114, register 116, register 118, multiplexer 120, multiplexer 122, gate 502, and gate 504. The shifter 800 may be used to implement and/or may be implemented by latency shifter 206 of FIG. 2, and/or the shifter 500 of FIG. 5.

The example of shifter 800 shown in FIG. 8 differs from that shown in FIG. 1 and/or FIG. 5 by its use of buffers between some registers in the forward signal propagation path, such as buffer 802 and buffer 804. The buffers (which may be implemented, for example, using inverters) may provide for timing adjustment.

Figure 9:
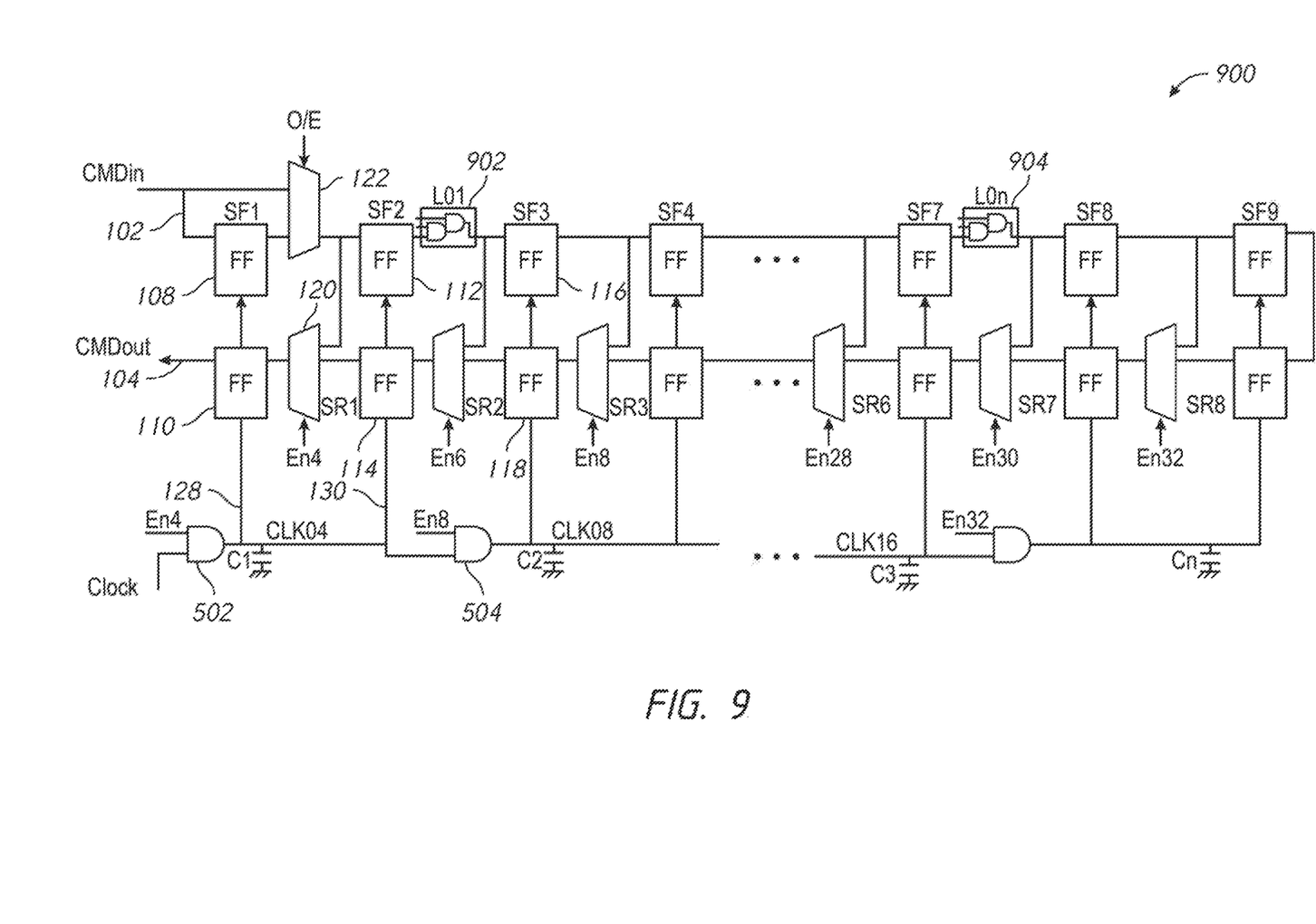
FIG. 9 is a schematic illustration of an apparatus arranged in accordance with examples described herein.

FIG. 9 is a schematic illustration of an apparatus arranged in accordance with examples described herein. The shifter 900 may include like components to the shifter 100 of FIG. 1 and/or the shifter 500 of FIG. 5, such as input 102, output 104, register 108, register 110, register 112, register 114, register 116, register 118, multiplexer 120, multiplexer 122, gate 502, and gate 504. The shifter 900 may be used to implement and/or may be implemented by latency shifter 206 of FIG. 2, and/or the shifter 500 of FIG. 5.

The example of shifter 900 shown in FIG. 9 differs from that shown in FIG. 1 and/or FIG. 5 by its use of logic between some registers in the forward signal propagation path, such as logic 902 and logic 904. The logic may receive a command interrupt halt signal and/or a command interrupt signal at an input of the logic and may accordingly halt progress of a signal through the shifter 900.

Figure 10:
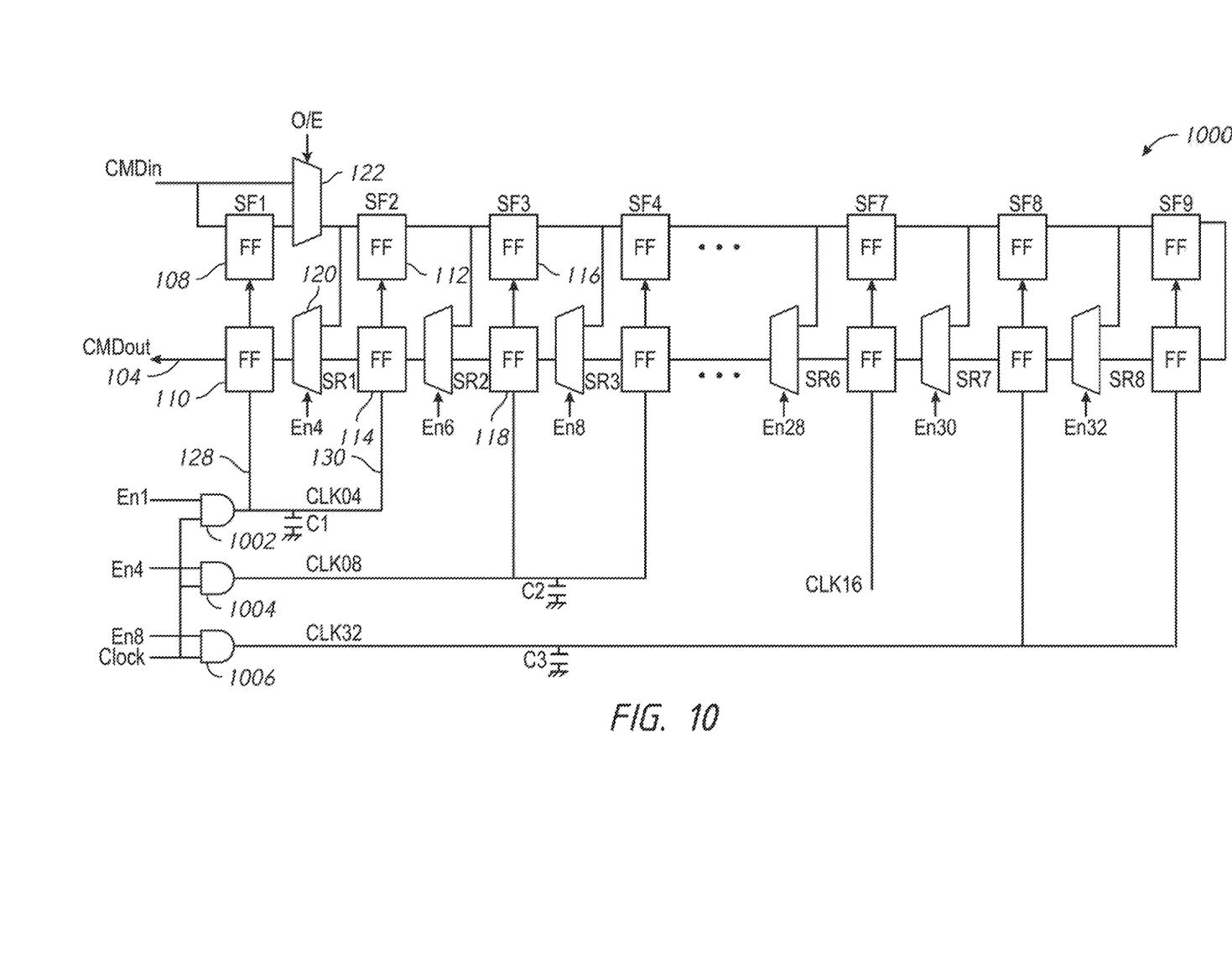
FIG. 10 is a schematic illustration of an apparatus arranged in accordance with examples described herein.

FIG. 10 is a schematic illustration of an apparatus arranged in accordance with examples described herein. The shifter 1000 may include like components to the shifter 100 of FIG. 1 and/or the shifter 500 of FIG. 5, such as input 102, output 104, register 108, register 110, register 112, register 114, register 116, register 118, multiplexer 120, and multiplexer 122. The shifter 1000 may be used to implement and/or may be implemented by latency shifter 206 of FIG. 2, and/or the shifter 500 of FIG. 5.

The example of shifter 1000 shown in FIG. 10 differs from that shown in FIG. 1 and/or FIG. 5 by its distribution of the clock signal. Logic gates may be provided at one end of the shifter 1000 which may each receive a clock signal (e.g., CLK) and a respective enable signal. For example, gate 1002 may receive CLK and En1, gate 1004 may receive CLK and En4, gate 1006 may receive CLK and En8. The gates gate 1002, gate 1004, and gate 1006 may be implemented, for example, using NAND gates. The output of each of the NAND gates may be used to provide a clock signal to a respective group of registers in the shifter 1000. For example, an output of gate 1002 may provide a clock signal to a first four registers. An output of gate 1004 may provide a clock signal to a next four registers. An output of gate 1006 may provide a clock signal to a next four registers.

Figure 11:
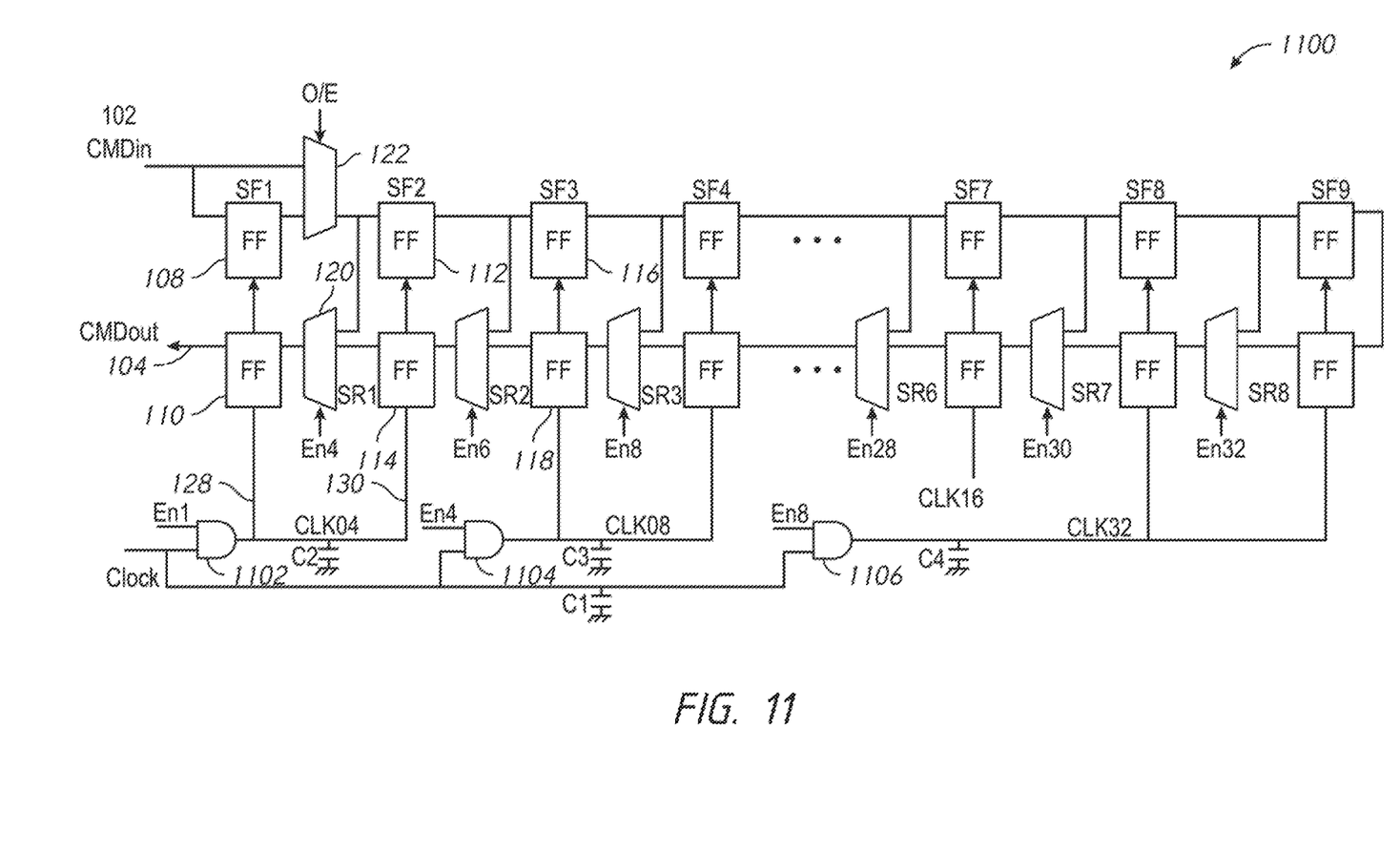
FIG. 11 is a schematic illustration of an apparatus arranged in accordance with examples described herein.

FIG. 11 is a schematic illustration of an apparatus arranged in accordance with examples described herein. The shifter 1100 may include like components to the shifter 100 of FIG. 1 and/or the shifter 500 of FIG. 5, such as input 102, output 104, register 108, register 110, register 112, register 114, register 116, register 118, multiplexer 120, and multiplexer 122. The shifter 1100 may be used to implement and/or may be implemented by latency shifter 206 of FIG. 2, and/or the shifter 500 of FIG. 5.

The example of shifter 1100 shown in FIG. 11 differs from that shown in FIG. 1 and/or FIG. 5 by its distribution of the clock signal. Logic gates may be provided along the shifter 1100 which may each receive a clock signal (e.g., CLK) and a respective enable signal. For example, gate 1102 may receive CLK and En1, gate 1104 may receive CLK and En4, gate 1106 may receive CLK and En8. The gate 1102, gate 1104, and gate 1106 may be implemented, for example, using NAND gates. The output of each of the NAND gates may be used to provide a clock signal to a respective group of registers in the shifter 1100. For example, an output of gate 1102 may provide a clock signal to a first four registers.

An output of gate 1104 may provide a clock signal to a next four registers. An output of gate 1106 may provide a clock signal to a next four registers.

Figure 12:
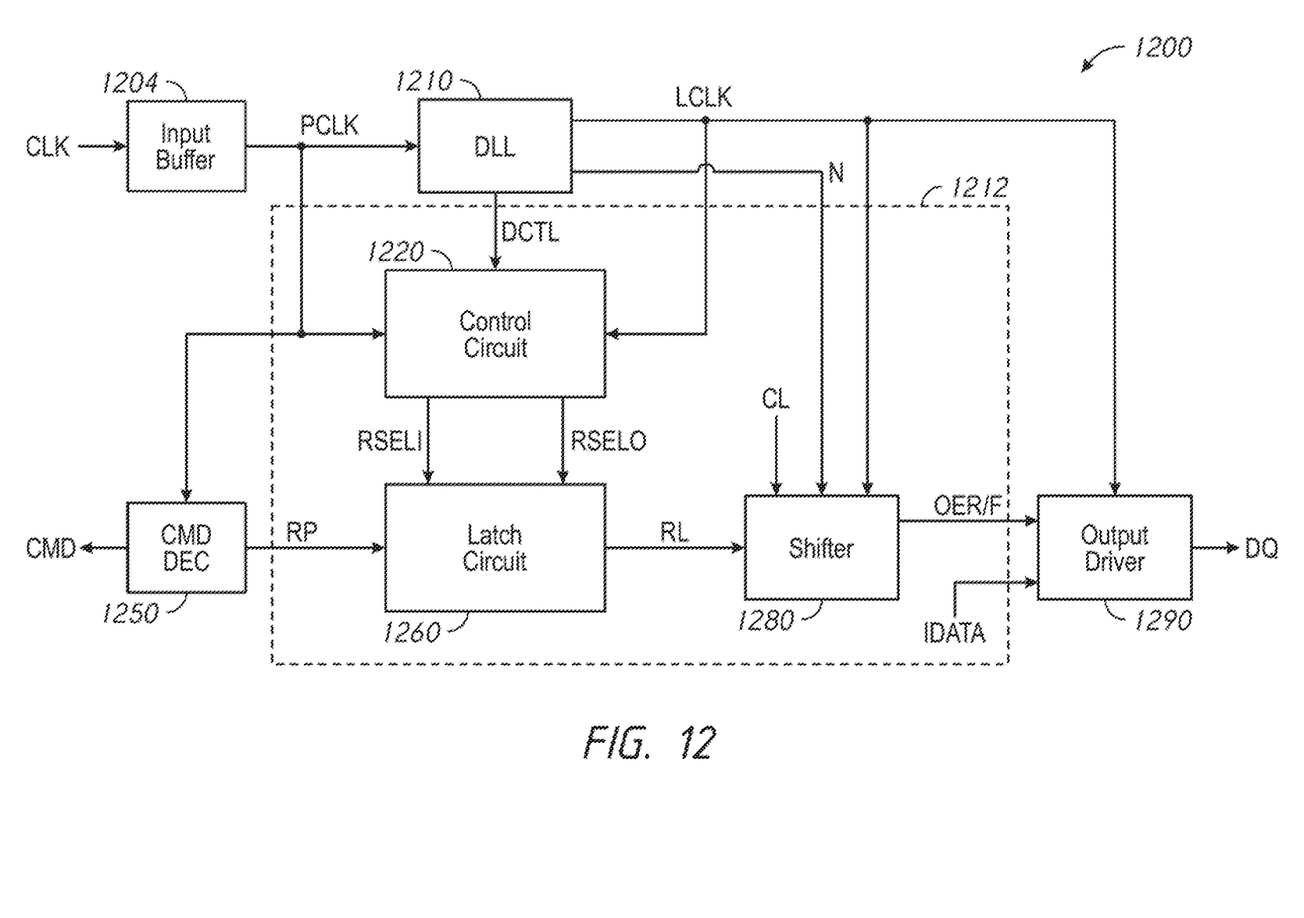
FIG. 12 is a schematic illustration of an apparatus arranged in accordance with examples described herein.

FIG. 12 is a schematic illustration of an apparatus arranged in accordance with examples described herein. Referring to FIG. 12, a particular illustrative embodiment of an apparatus including a latency control circuit 1212 is disclosed and generally designated 1200. As used herein, examples of apparatuses may include an integrated circuit, a memory device, a memory system, an electronic device or system, a smart phone, a tablet, a computer, a server, etc. The apparatus 1200 may include an input buffer 1204 coupled to a delay-locked loop DLL 1210. The input buffer 1204 may be configured to receive an external clock signal CLK and to provide a buffered clock signal PCLK to the DLL 1210, to the latency control circuit 1212, and a command decoder 1250. The DLL 1210 may be configured to provide an internal clock signal LCLK, a delay control signal DCTL, and a counter signal N to the latency control circuit 1212. The apparatus 1200 may further include a command decoder 1250 and an output driver 1290. The command decoder 1250 may be configured to decode a command signal CMD to provide a decoded command RP, and the output driver 1290 may be configured to provide the data DQ at an output based on the internal clock signal and output enable rising/falling signals OER/F from the latency control circuit 1212.

The DLL 1210 may provide the LCLK signal based on the PCLK signal. The DLL 1210 may adjust a delay of the PCLK signal to provide the LCLK such that timing of the DQ output from the output driver 1290 matches the phase of the CLK signal. The DLL 1210 may include an adjustable delay line, circuitry that models delays of circuitry of the apparatus 1200, and a phase detector that detects a phase difference between the LCLK signal fed through the model delays and the PCLK signal. The DLL 1210 may adjust a delay of the adjustable delay line via the DCTL signal. The DCLT signal may also be provided to the latency control circuit 1212 to control propagation of the RP signal.

The command decoder 1250 may be configured to decode the CMD signal respective to the PCLK signal to provide a pulse on the RP signal to the latency control circuit 1212. The CMD signal may be a memory access command, such as a read, write, or on die termination (ODT) command. The latency control circuit 1212 may include a latch control circuit 1220 coupled to a latch circuit 1260. The latch control circuit 1220 may receive the PCLK signal, the DCTL signal, and the LCLK signal. The latch control circuit 1220 may provide control signals RSELI and RSELO to the latch circuit 1260 responsive to the PCLK, DCTL, and LCLK signals. The latch control circuit 1220 may include one or more adjustable delay lines that mirror the delay line of the DLL 1210, with the delay of the one or more adjustable delay lines controlled by the DCTL signals. Thus, the relative timing of the RSELI control signals to the timing of the RSELO control signals may be related to the relative timing between the PCLK and LCLK signals.

The latch circuit 1260 may include latches configured to propagate the RP signal pulse to the RL signal. In some embodiments, the latch circuit 1260 may include a set of input latches configured to propagate the RP signal to a set of output latches responsive to the RSELI control signals and the set of output latches may be configured to propagate the RP signal to an output as the RL signal responsive to the RSELO control signals.

The latency control circuit 1212 may further include a shifter 1280 configured to receive the RL signal pulse from the latch circuit 1260 and a count signal N and the LCLK signal from the DLL 1210. The N signal may be provided to shifter 1280 after the CLK and LCLK signals are synchronized through a series of delay elements of the adjustable delay line of the DLL 1210. The N signal may be a count of the number of tCK calculated by the DLL 1210 to achieve the locking condition (e.g., a tCK count indicating a latency between the CLK signal and the LCLK signal). The shifter 1280 is further configured to receive latency information which indicates a specified latency CL. The shifter 1280 may assert the OER/F signals based on the CL, the N signal, and the LCLK signal. The shifter 1280 may be implemented using any shifters described herein, including, for examples shifter 100 of FIG. 1, shifter 300 of FIG. 3, shifter 500 of FIG. 5, or any other shifter or apparatus described herein. The output driver 1290 may receive the OER/F signals, the LCLK signal, and input data IDATA, and may propagate the IDATA to data DQ responsive to the OER/F signals and the LCLK signal.

In operation, the apparatus 1200 may receive a CLK signal at the input buffer 1204 and the CMD signal the command decoder 1250, which may be received based on timing of the PCLK signal. When the CMD signal includes a read command, the apparatus 1200 may operate according to the read latency CL. The read latency CL may specify a timing of output of the IDATA to the data DQ responsive to the read command based on the CLK signal, which includes time for data to be accessed and provided on an output bus (e.g., via a DQ pad). In an example, the read latency CL may be from 6-10 tCK. The read latency CL may be fixed in the apparatus 100 at a time of manufacture or may be set by a memory controller, such as via the CMD signal. The DLL 1210 and the latency control circuit 1212 may apply the read latency the IDATA and synchronize the IDATA with the CLK signal.

The DLL 1210 may receive the PCLK signal from the input buffer 1204, and may provide the LCLK signal, which may be used by the output driver 1290 to latch the IDATA data to the DQ of the apparatus 1200. The LCLK may have a timing relationship relative to the PCLK signal, which may be determined by the DLL 1210, and provided at an output as the N signal. The N signal may be a count of the number of tCK to achieve the locking condition (e.g., a tCK latency between receipt of the CLK signal and the LCLK signal). The locking condition may be achieved such that the LCLK signal at an output of the apparatus 1200 matches a phase of the CLK signal. The N signal may be provided to the shifter 1280 after the locking condition is achieved. The DLL 1210 may also generate the DCTL signal, which may be used to select the delay of the adjustable delay line of the DLL 1210.

The command decoder 1250 may decode the CMD signal and provide the decoded CMD signal to the latency control circuit 1212 as the RP signal. The latency control circuit 1212 may use the PCLK and LCLK signals to change timings of internal read command pulses from being relative to the PCLK signal to being relative to the LCLK signal during a memory read operation. The latch control circuit 1220 may include a counter configured to count the PCLK signals, and the RSELI control signals may be asserted based on the count of the counter. For example, the latch control circuit 1220 may include a decoder that is configured to assert a single one of the RSELI control signals with every clock cycle based on the count provided by the counter. The counter value may also be used to provide the RSELO signals. In one embodiment, the latch control circuit 1220 may include one or more adjustable delay lines having delays selected by the DCTL signal that are configured to delay the counter signal values by the same delay as the delay applied to the PCLK signal to provide the LCLK signal. The RSELO control signals may be provided based on the delayed counter signal values. For example, the latch control circuit 1220 may include a second decoder that is configured to assert a single one of the RSELO signals with every clock cycle based on the delayed counter signal values. In other embodiments, the RESLI signals may be directly delayed via the one or more adjustable delay lines to provide the RSELO signals.

The RSELI and RSELO signals may be received by the latch circuit 1260, and may control propagation of the RP signal to the shifter 1280 as the RL signal pulse. The RP signal pulse may be initially received and latched by the latch circuit 1260 responsive to an asserted one of the RSELI signals. Subsequently, the latched RP signal may be propagated to the shifter 1280 as the RL signal responsive to a corresponding asserted one of the RSELO signals. In response to receiving the combination of the RL signal from the latch circuit 1260 and the N signal, the shifter 1280 may assert the OER/F signals based on the read latency CL and the N signal. Because the N signal indicates a count of the tCK that have elapsed between receipt of the CLK signal and the LCLK signal, which is the same tCK count between receipt of the CMD signal and the RL signal, the value of the N signal may be subtracted from the CLK to account for the already elapsed tCK. Responsive to assertion of the OER/F signals, the output driver 1290 may provide the IDATA as data DQ relative to the timing of the LCLK, and as required by the specified latency CL.

The latch control circuit 1220 that times the RSELI and RSELO relative to a single counter may save complexity and improve reliability as compared with coordinating timing of the RSELI and RSELO signals between two different counters. Additional delay models that unnecessarily consume extra chip space are thereby reduced by utilizing the RSELI and RSELO signals that can be provided directly to the latch circuit 1260. High speed operations may be better achieved by utilizing a clock-based control system such as the latency control circuit 1212.

From the foregoing it will be appreciated that, although specific embodiments have been described herein for purposes of illustration, various modifications may be made while remaining with the scope of the claimed technology.

The apparatus shown in FIG. 12 and/or shifters described herein may be implemented in any of a variety of products employing memory including products employing processors and memory including for example cameras, phones, wireless devices, displays, chip sets, set top boxes, gaming systems, vehicles, and appliances. Resulting devices employing the memory system may benefit from the embodiments of a latency shifter described above to perform their ultimate user function.

What is claimed is:

1. An apparatus comprising:
a shifter configured to receive a command signal at an input node and provide the command signal at an output node a delay time after receiving the command signal, wherein the shifter comprises:
an input register coupled to the input node and configured to receive the command signal from the input node;
an output register coupled to output node and configured to provide the command signal to the output node; and
a plurality of registers arranged in series between the input register and the output register, wherein the apparatus is configured to propagate the command signal through a variable number of the plurality of registers between the input register and the output register, and wherein the variable number is based on a control signal received by the shifter.

2. The apparatus of claim 1 further comprises one or more multiplexers configured to determine the variable number based on the control signal.

3. The apparatus of claim 1, wherein the plurality of registers comprise additional input registers and additional output registers, and wherein a number of input registers in the plurality of registers is same as a number of output registers in the plurality of registers.

4. The apparatus of claim 3, wherein the input registers in the plurality of registers are coupled in series in a first pipeline, the first pipeline coupled to the input register and configured to propagate the command signal in a first direction.

5. The apparatus of claim 4, wherein the output registers in the plurality of registers are coupled in series in a second pipeline, the second pipeline coupled between the first pipeline and the output register and configured to propagate the command signal from the first pipeline in a second direction opposite the first direction.

6. The apparatus of claim 5, wherein an input register in the plurality of registers is aligned with a respective output register in the plurality of registers in a third direction perpendicular to the first direction.

7. The apparatus of claim 3 further comprising one or more buffer circuits each coupled between two adjacent input registers in the plurality of registers and configured to delay the propagation of the command signal.

8. The apparatus of claim 1 further comprising one or more interrupt circuits, each coupled between two adjacent registers in the plurality of registers, and configured to interrupt the propagation of the command signal responsive to an interrupt signal.

9. An apparatus comprising:
a first delay path comprising a first plurality of serially coupled registers and configured to propagate a command signal in a first direction;
a second delay path comprising a second plurality of serially coupled registers and configured to propagate the command signal from the first plurality of registers in a second direction opposite the first direction;
wherein a number of the first plurality of registers is same as a number of the second plurality of registers, and wherein each of the first plurality of registers has a same number of fan-out, and each of the second plurality of registers has a same number of fan-out.

10. The apparatus of claim 9 further comprising a first multiplexer coupled between a first register of the second plurality of registers and a second register of the second plurality of registers adjacent to the first register, and configured to provide output of the first register or output of a corresponding register in the first plurality of registers to input of the second register of the second plurality of registers.

11. The apparatus of claim 10 further comprising a second multiplexer coupled between a third register of the second plurality of registers and a fourth register of the second plurality of registers adjacent to the third register, and configured to provide output of the third register or output of a corresponding register in the first plurality of registers to input of the fourth register of the second plurality of registers.

12. The apparatus of claim 9 further comprising a multiplexer coupled between a first register of the first plurality of registers and a second register of the first plurality of registers adjacent to the first register, and configured to control an even or odd number of register delays in the first and second delay paths.

13. The apparatus of claim 9, wherein each of the first plurality of registers is adjacent to a respective one of the second plurality of registers.

14. The apparatus of claim 9, wherein input of the first delay path and output of the second delay path are on a same end of a circuit.

15. An apparatus comprising:
a plurality of serially coupled delay units configured to propagate a command signal, wherein each of the plurality of serially coupled delay units comprises:
first and second registers serially coupled to each other and configured to propagate a first signal from a preceding delay unit in a first direction;
third and fourth registers serially coupled to each other and configured to propagate a second signal from a subsequent delay unit in a second direction opposite the first direction, wherein the first and fourth registers are arranged in line in a third direction perpendicular to the first direction, and wherein the second and third registers are arranged in line in the third direction; and
a branch line perpendicular to the first direction and coupled to the first, the second, the third and the fourth registers to provide a clock signal.

16. The apparatus of claim 15, wherein the branch line comprises first and second branch lines parallel to each other, wherein the first branch line is coupled to the first and fourth registers and configured to clock the first and fourth registers, and wherein the second branch line is coupled to the second and third registers and configured to clock the second and third registers.

17. The apparatus of claim 16 further comprising a conductive line coupled to each of the plurality of delay units a respective clock signal based on a clock signal on the conductive line and a respective enable signal.

18. The apparatus of claim 15 further comprising a first multiplexer coupled between first and second delay units of the plurality of delay units, wherein the first and second delay units are adjacent to each other, the first multiplexer is configured to:
provide output of the second register in the first delay unit or output of the fourth register in the second delay unit to input of the third register in the first delay unit responsive to a control signal.

19. The apparatus of claim 15, wherein output of the second register in a first delay unit of the plurality of delay units is coupled to input of the first register in a second delay unit of the plurality of delay units, wherein the first and second delay units are adjacent to each other.

20. The apparatus of claim 19, wherein a first clock signal is provided to the second delay unit, the first clock signal is based on a second clock signal provided to the first delay unit.

* * * * *